(12) United States Patent
Castillo et al.

(10) Patent No.: US 6,422,399 B1
(45) Date of Patent: Jul. 23, 2002

(54) RACK SYSTEM AND METHOD HAVING TOOL-LESS RELEASABLE ARM ASSEMBLY

(75) Inventors: Henry Castillo, Georgetown; Randolph D. Gray; Robert J. Neville, Jr., both of Round Rock; Tiffany J. Williams; Jerry D. Gandre, both of Austin, all of TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/718,201

(22) Filed: Nov. 21, 2000

(51) Int. Cl.[7] .................................................. A47F 5/00
(52) U.S. Cl. ..................... 211/26; 211/191; 211/175; 211/192; 312/223.2; 312/265.4; 361/683
(58) Field of Search ................................. 211/190, 191, 211/175, 26, 192, 189; 312/265.1, 265.2, 265.3, 265.4, 265.5, 265.6, 223.2; 361/683, 829, 726

(56) References Cited

U.S. PATENT DOCUMENTS 3,133,768 A * 5/1964 Klakovich 3,680,711 A * 8/1972 Brucker (List continued on next page.)

OTHER PUBLICATIONS

U.S. Pending Patent Appl. Ser. No. 09/489,409 entitled "*Apparatus for Providing Displacement to A Slide Mounted Chassis in a Rack*" by Johnson, et al., assigned to Dell USA L.P. (Atty's Dkt 016295.0545 (DC–02146), Filed Jan. 21, 2000.

(List continued on next page.)

*Primary Examiner*—Robert W. Gibson, Jr.
(74) *Attorney, Agent, or Firm*—Baker Botts L.L.P.

(57) ABSTRACT

The present disclosure describes a system and method for installing support structures within rack systems for supporting components. In one aspect, a rack system is disclosed that includes a rack with a plurality of rails that each have a standard interface portion. The system also includes an arm assembly with an arm, a front rail interface, and a rear rail interface. The front rail interface may be disposed at one end of the arm and includes an interface portion formed to tool-lessly and releasably secure the end of the arm to an interface portion of a rack rail.

32 Claims, 3 Drawing Sheets

FIG. 1B

U.S. PATENT DOCUMENTS

| | | | | |
|---|---|---|---|---|
| 3,697,034 | A | * | 10/1972 | Shell |
| 4,184,726 | A | | 1/1980 | Cox .......................... 312/320 |
| 4,406,374 | A | * | 9/1983 | Yedor ........................ 211/192 |
| 4,931,907 | A | | 6/1990 | Robinson et al. ........... 361/391 |
| 5,460,441 | A | | 10/1995 | Hastings et al. ............ 312/298 |
| 5,505,533 | A | | 4/1996 | Kammersqard et al. .... 312/236 |
| 5,546,277 | A | | 8/1996 | Zandbergen |
| 5,571,256 | A | | 11/1996 | Good et al. |
| 5,791,498 | A | | 8/1998 | Mills .......................... 211/26 |
| 5,833,337 | A | * | 11/1998 | Kofstad .................. 211/175 X |
| 5,850,925 | A | | 12/1998 | Gandre ........................ 211/26 |
| 5,941,621 | A | | 8/1999 | Boulay et al. |
| 6,011,701 | A | | 1/2000 | Kopp et al. ................. 361/818 |
| 6,021,047 | A | | 2/2000 | Lopez et al. ................ 361/727 |
| 6,021,909 | A | | 2/2000 | Tang et al. |
| 6,070,742 | A | | 6/2000 | McAnally et al. ............ 211/26 |
| 6,070,841 | A | | 6/2000 | Robinson ............... 248/220.43 |
| 6,070,957 | A | * | 6/2000 | Zachvai ............... 312/265.1 X |
| 6,095,345 | A | | 8/2000 | Gibbons ...................... 211/26 |
| 6,142,590 | A | | 11/2000 | Harwell ................... 312/223.1 |
| 6,181,549 | B1 | * | 1/2001 | Mills et al. ................ 361/683 |
| 6,185,092 | B1 | * | 2/2001 | Landrum et al. ........... 361/683 |
| 6,223,908 | B1 | * | 5/2001 | Kurtsman .................... 211/26 |
| 6,230,903 | B1 | * | 5/2001 | Abbott ........................ 211/26 |
| 6,273,534 | B1 | * | 8/2001 | Bueley et al. |

OTHER PUBLICATIONS

U.S.Pending Patent Appl. Ser. No. 09/518,841 entitled "*Rack Mount Slide System Enabling Front, Top and Rear Access to a Rack Mounted Device*" by Baddour et al., assigned to Dell Products L..P. (Atty's Dkt 016295.0571 (DC–02172), Filed Mar. 3, 2000.

U.S. Patent Patent Appl. Ser. No. 08/881,289 entitled "*Chassis Retaining for an Electronics Rack*" by Mills et al., assigned to Dell USA L.P. (Client No. DC–01275), Filed Jun. 24, 1997.

U.S. Pending Patent Appl. Ser. No. 09/470,280 entitled "*Connector Arrangement and Connecting Method for Cable Management Arms*", assigned to Dell USA L.P. (Client No. DC–02095), Filed Dec. 22, 1999.

\* cited by examiner

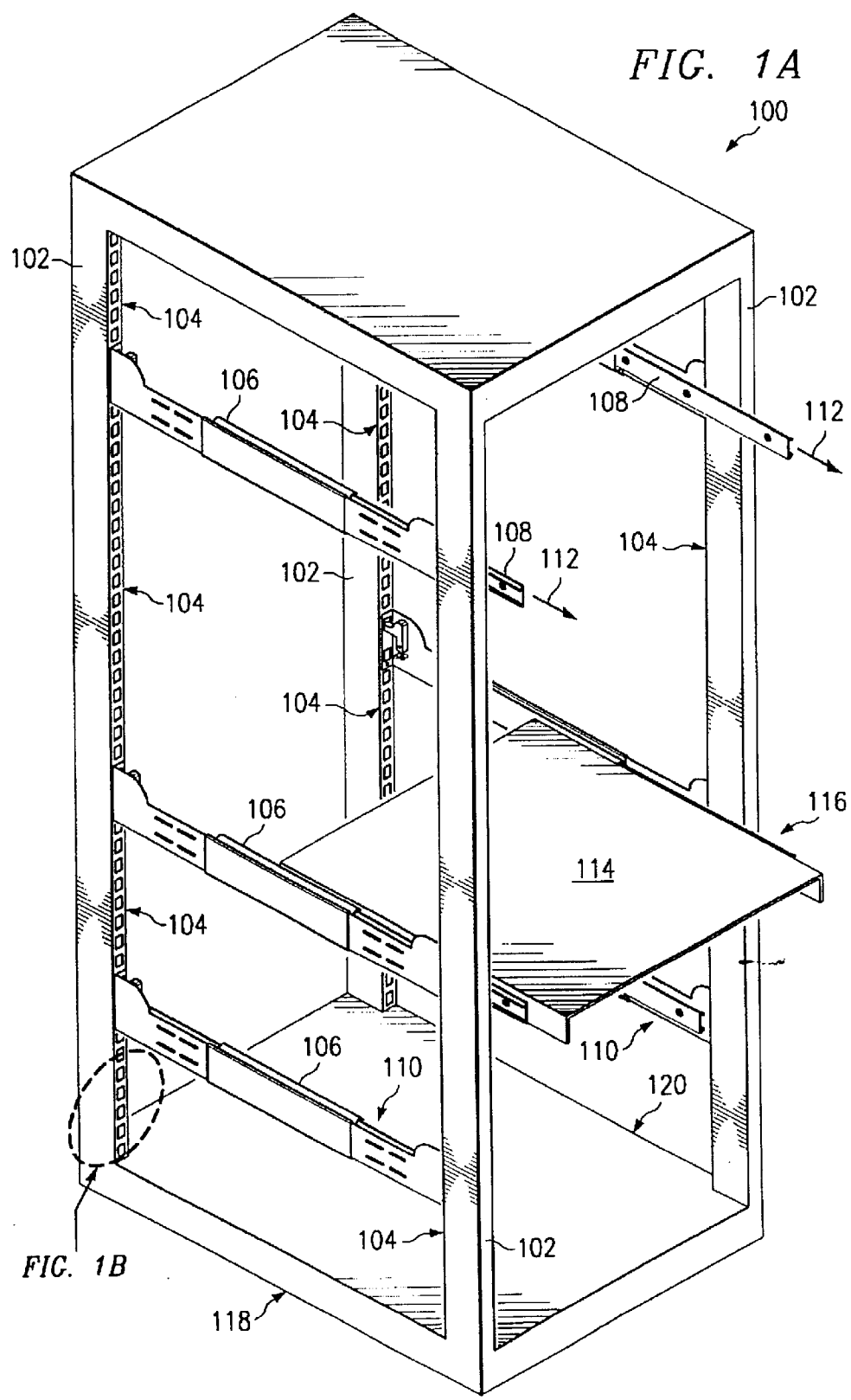

RACK SYSTEM AND METHOD HAVING TOOL-LESS RELEASABLE ARM ASSEMBLY

TECHNICAL FIELD

This disclosure relates in general to the field of A electronics and more specifically relates to a rack system and method having a tool-less releasable arm assembly.

BACKGROUND

Electronic devices such as computer components are often stored in an electronic rack system, sometimes referred to as a rack system or rack, to conserve floor space. A variety of different computer components including servers, computers, storage devices such as disk drives, tape drives, and RAID drives, as well as other electrical devices can be housed in rack systems. Standards such as the Electronics Industry Association (EIA) RS-310 19" rack standard have been developed to standardize the height and width of electronic rack systems to facilitate effective use of the space within rack systems.

The vertical space within a rack system is generally defined in vertical mounting unit increments, often referred to as "U's". A mounting unit or U is typically 1.75 inches. Interior rails of rack systems often have three mounting slots selectively spaced within each U of vertical space for attaching components. Rack systems and components are typically sized in mounting unit increments. For example, "2U" components are sized to fit within a 2U vertical space. "48U" and "72U" racks are sized to have 48U and 72U, respectively, of usable vertical space.

Access to components is often provided by a slideable shelf, slideable arms, or other support structures attached to interior rails of the rack system. These structures allow the associated components to slide forward for maintenance, repair, or installation.

A common problem with such support structures is that assembly of the arms within the rack is often difficult, confusing, and time consuming. Typically, arms and shelves that support components are secured to interior rails of the rack system using loose connectors such as screws, nuts, washers, and bolts, that often require the use of specialized tools. Assembly using loose connectors is often further complicated by the limited work space within rack systems that house multiple components and a complex assortment of cabling. In addition to often being a frustrating exercise, installing traditional support structures can consume a significant amount of the scarce and valuable time of skilled technicians.

After a support structure has been installed within a rack, removal of the support structure often proves to be a daunting task as well. Gaining access to the connectors and manipulating tools for removing a support structure from a rack can prove difficult because of the close confines of typical rack systems, components, and associated cabling. These difficulties discourage rearranging support structures within rack systems to manage rack space to meet changing space and component requirements.

SUMMARY

In accordance with teachings of the present disclosure, a system and method having a tool-less releasable arm assembly are described for installing support structures within rack systems for supporting components.

In one aspect, a rack system is disclosed that includes a rack with a plurality of rails that each have a standard interface portion. The system also includes an arm with a front end, a rear end, a front rail interface, and a rear rail interface. The front rail interface may be disposed at the front end of the arm and is formed to tool-lessly and releasably secure the first end of the arm to the standard interface portion of a rail. The rear rail interface may be disposed at the rear end of the arm formed to tool-lessly and releasably secure the second end of the arm to the standard interface portion of a rail. More specifically, the front and rear rail interface portions may include hooks extending from the front rail interface and the rear rail interface, having a downward facing L-shaped configuration.

In another aspect of the present disclosure, a method for installing an arm assembly within a rack system is disclosed that includes aligning a rail interface with the interface portion of a rail within a rack system. The arm assembly is then tool-lessly and releasably secured to the interface portions of the rack system. The method then includes repeating these steps for a secured rail. More specifically, the method includes aligning the arm assembly hooks with the desired interface portion of the rack rails such that a latch assembly moves to a first or catch position that secures the arm assembly to the rack rail.

The present disclosure provides a number of important technical advantages. One advantage is providing an arm assembly that may be tool-lessly and releasably secured to a rack. Accordingly, the arm assembly may be secured to a desired rack rail without the use of specialized tools or loose connectors. The arm assembly further facilitates the removal of the arm assembly from a rack or for repositioning within a rack system.

Further technical advantages are demonstrated by the claims, figures, and detailed description.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features and wherein:

FIGS. 1A and 1B are schematic diagrams showing one embodiment of a rack system having rails with arm assemblies releasably secured thereto according to the present disclosure;

DETAILED DESCRIPTION

Preferred embodiments and their advantages are best understood by reference to FIGS. 1A through 3, wherein like numbers are used to indicate like and corresponding parts.

Figure 1B:
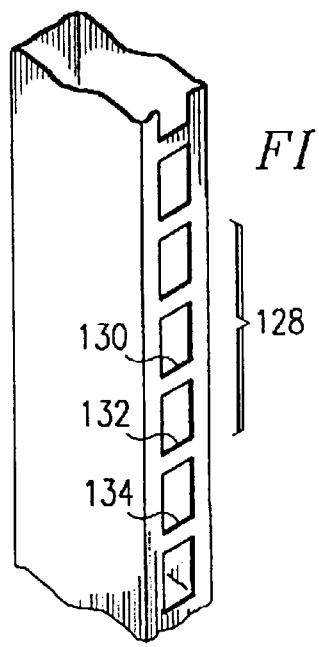

Now referring to FIGS. 1A and 1B, schematic diagrams of one embodiment of a rack system according to the present disclosure are shown. Rack system 100 includes a plurality of rails 102. The rails 102 are aligned along first side 118 and second side 120. Each rail 102 preferably has standard interface portion 104, which include a plurality of apertures or mounting slots. In a preferred embodiment, standard interface portion 104 may comply with a rack standard such as the EIA RS 310 standard. In such an embodiment, standard interface portion 104 may be divided into a plurality of defined mounting units 128 wherein each mounting unit 128 includes first aperture 130, second aperture 132, and third aperture 134, as shown in FIG. 1B. Further, in this preferred embodiment, the spacing between first aperture 130, second aperture 132, and third aperture 134 are generally spaced equidistant from one another in accordance with EIA RS 310 or another suitable standard or spacing convention. Furthermore, the spacing between each mounting unit is also in accordance with EIA RS 310 wherein the spacing between the third aperture of one mounting unit and the the first aperture of an adjacent mounting unit is generally less than the spacing between first aperture 130 and second aperture 132, and second aperture 132 and third aperture 134.

Rack system 100 may further include one or more pairs of arm assemblies 106. Arm assemblies 106 preferably include slide assemblies 108 movable between first, retracted position 110 and second, extended position 112. Slide assemblies 108 may preferably be formed to support a component such as a server, computer, storage device, or other component. A component may be secured to slide assembly 108 while positioned in its second, extended position 112.

After installation of a component, slide assembly 108 may be selectively moved to its first, retracted position 110 and effectively housed within rack system 100. The component may be accessed for maintenance, repair, or removal purposes by positioning slide assembly 108 in its second, extended position 112.

In a particular embodiment, slide assembly 108 may include a telescoping slide. In another embodiment, a pair of slide assemblies 108 may incorporate shelf 114. Components may then be selectively secured to shelf 114 within rack system 100.

Figure 2A:
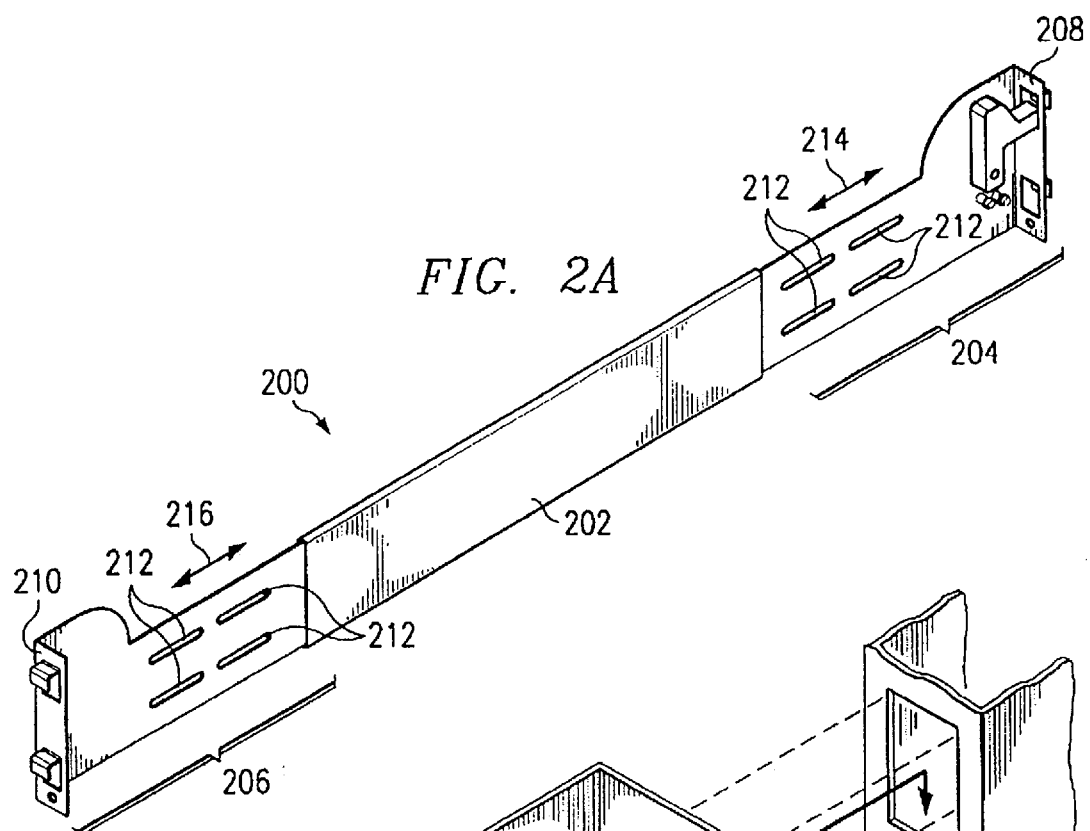
FIG. 2A is a schematic diagram showing one embodiment of an arm assembly according to the present disclosure.

Now referring to FIG. 2A, a schematic diagram of one embodiment of an arm assembly according to the present disclosure is shown. Arm assembly 200 includes arm 202 having front or first end 204 and rear or second end 206. Front end 204 includes front or first rail interface 208. Rear end 206 includes rear or second rail interface 210.

In a preferred embodiment, front end 204 and rear end 206 may be selectively lengthened or shortened with respect to arm 202 by positioning front end 204 or rear end 206 along adjustment slot 212. Such adjustment allows front end 204 and rear end 206 to be selectively positioned in the direction of arrows 214 and 216, respectively. This also allows arm assembly 200 to be used with rack systems of different depths.

Figure 2B:
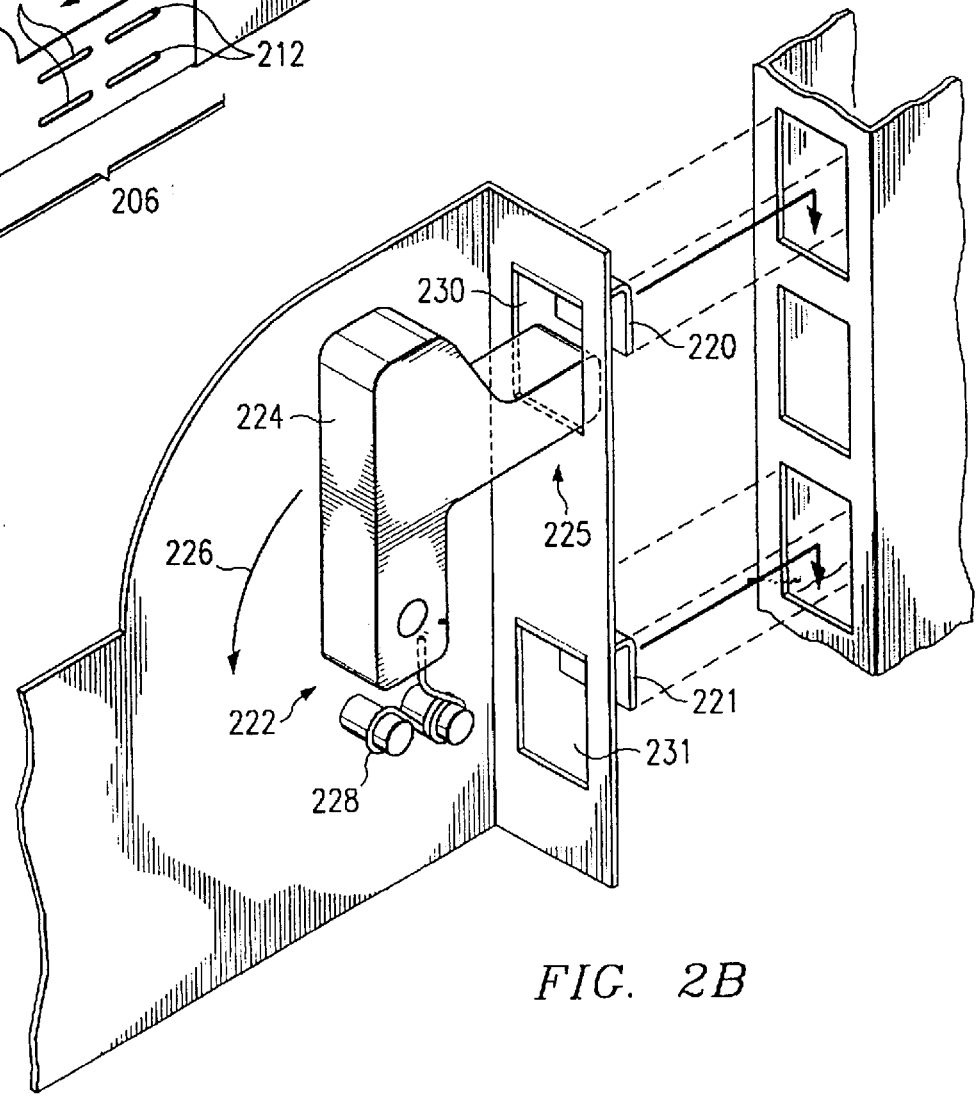
FIG. 2B is a schematic diagram showing one embodiment of an arm assembly, with portions broken away, including one example of a releasable latch assembly.

Now referring to FIG. 2B, a schematic diagram of one embodiment of an arm assembly including one embodiment of a securing mechanism, specifically, a pivotable, releasable latch assembly is shown. Arm assembly 200 includes front rail interface 208. In the present embodiment, front rail interface 208 extends substantially perpendicular from arm 202. First hook 220 and second hook 221 extend from front rail interface 208, forming openings 230 and 231. In the present embodiment, hooks 220 and 221 extend from rail interface 208 and have a downward facing, generally L-shaped configuration.

Releasable latch assembly 222 is preferably pivotally coupled to front end 204. Latch assembly 222 includes latch 224 and spring 228. Latch 224 is preferably selectively movable between first, catch position 225, as shown, and second, release position in the direction of arrow 226. In first, catch position 225 a portion of latch 224 protrudes through opening 230. In a preferred embodiment, this protruding portion has a generally rounded configuration. Spring assembly 228 applies tension to latch 224 such that latch 224 is biased toward its first, catch position 225

Note that the present embodiment includes latch assembly 224 associated with front end 204, as shown in FIG. 2A. In an alternative embodiment, a latch assembly may be included at both front end 204 and rear end 206. Also, in operation, front end 204 and rear end 206 may be disassembled from arm 202 and reversed, such that front end 204 may interface with the rear of rack system 100, and rear end 206 may interface with the front of rack system 100.

Figure 3:
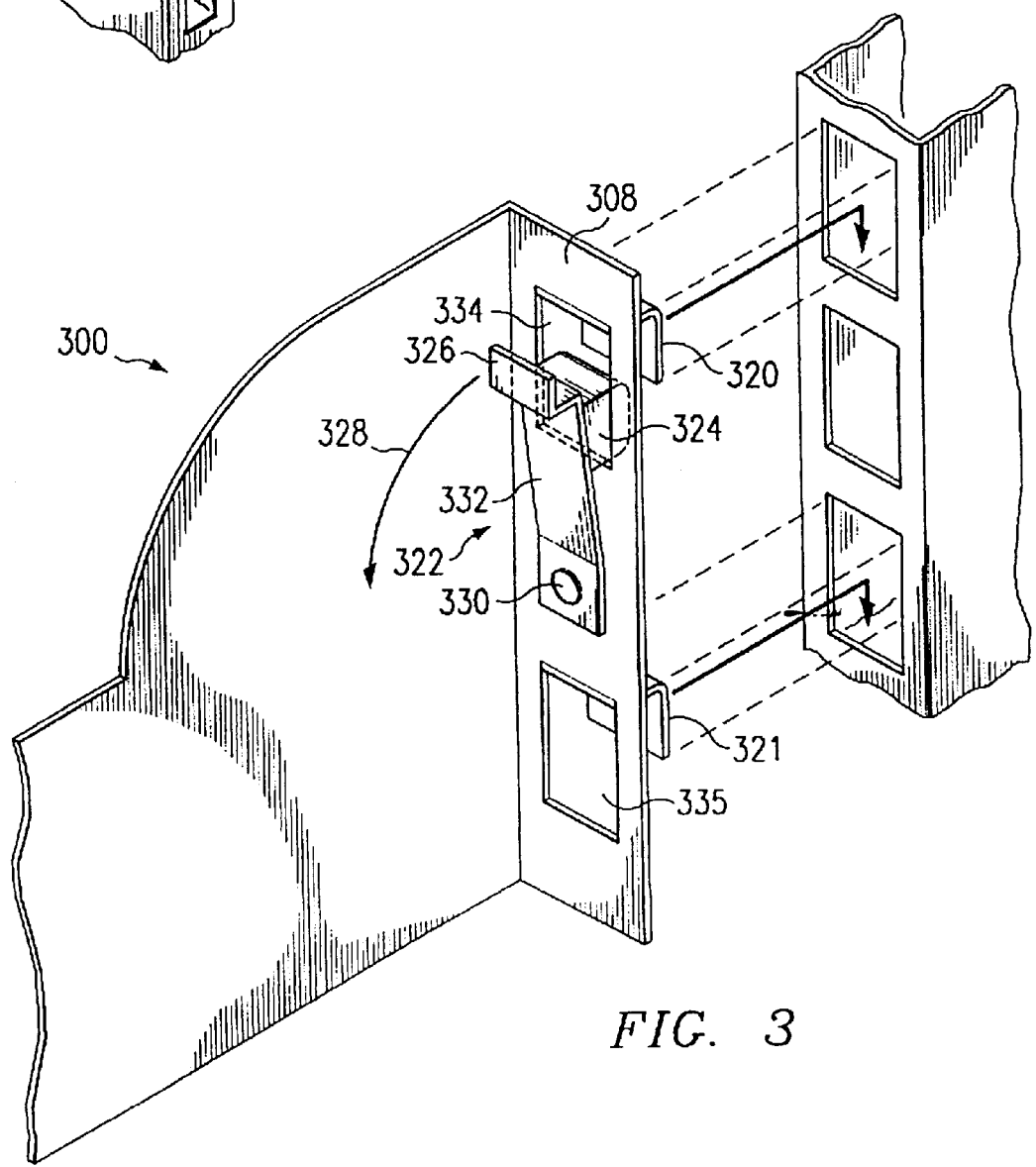
FIG. 3 is a schematic diagram showing a portion of another embodiment of an arm assembly, with portions broken away, including another example of a releasable latch assembly.

Note that in an alternative embodiment, latch assembly 224 may comprise an alternative securing mechanism. One alternative securing mechanism, is shown in FIG. 3. Additionally, other suitable securing mechanisms may be employed to releasably secure either front end 204 or rear end 206 to a rail without departing from the spirit and scope of the present disclosure.

In operation, a pair of arm assemblies 200 are preferably provided. Hooks 220 and 221 of both arm assemblies are respectively aligned with standard interface portion 104 of two rails 102 on first side 118 of rack system 100, as shown in FIG. 1. First arm assembly 200 may then by secured to interface portions 104 by moving latch 224 into catch position 225. In a preferred embodiment latch assembly 222 automatically moves into catch position 225 when latch 224 is aligned with a mounting aperture.

A second arm assembly may then be installed by preferably aligning hooks 220 and 221 of a second arm assembly with standard interface portion 104 of rails on a second side 120. The second arm assembly should preferably be positioned at substantially the same height as the first arm assembly. The second arm assembly may then be preferably secured to interface portions 104 of two rails 102 on second side 120 with latch assembly 222. In the present embodiment, latch assembly 222 is preferably a pivotable, releasable latch assembly. Alternatively, a releasable latch assembly as shown in FIG. 3 or another suitable, selectively releasable latch assembly may be used to secure arm assembly 200 to interface portion 104.

In a preferred embodiment, the step of aligning hooks 220 and 221 with interface portion 104 causes the portion of latch 224 that protrudes through opening 230 to contact a portion of interface portion 104. This contact preferably coupled with a downward movement of arm assembly 200 preferably causes latch 224 to move to release position 226. Arm assembly 200 may then be positioned such that latch 224 is preferably aligned with the mounting slots of interface portion 104 such that latch 224 automatically moves into catch position 225 via the tension applied by spring 228.

After being secured to interface portion 104, arm assembly 200 may be selectively removed from rack 100 by moving latch 224 to release position 226 and lifting arm assembly 200.

The present embodiment shows the use of a single latch assembly disposed on either front end 204 or rear end 206. However, in one embodiment, both ends of arm assembly 200 may incorporate latch assembly 222.

In another preferred embodiment, first hook 220 and second hook 221 are preferably spaced to align with a first aperture 130 within a mounting unit 128 and a third aperture 134 within a mounting unit 128. This spacing may be within a single mounting unit or may span multiple mounting units such that first hook 220 may align with first aperture 130 within a first mounting unit and second hook 221 may align with a third aperture 134 within a lower mounting unit. This spacing prevents arm assembly 200 from being spaced incorrectly within a rack system. As discussed above, first aperture 130, second aperture 132, and third aperture 134 within a mounting unit are generally spaced equidistant from one another, and the spacing between mounting units is smaller than the spacing between the apertures within each mounting unit, in accordance with EIA RS-310.

After arm assemblies 200 are secured within rack system 100, slide assemblies 108 (as shown in FIG. 1) may be selectively extended. In this extended position 112, components may be secured to the extend portions of slide assemblies 108. Slide assemblies 108 may then be retracted to house components within rack system 100. Slide assemblies 108 may later be used to selectively access components for maintenance, repair or removal.

Now referring to FIG. 3, a schematic diagram showing a portion of another embodiment of an arm assembly including another releasable latch assembly is shown. As depicted arm assembly 300 includes front or first rail interface 308, and releasable latch assembly 322. In this preferred embodiment, front rail interface 308 extends substantially perpendicular from arm assembly 300. First hook 320 and second hook 321 extend from front rail interface 308 and preferably have a downward facing L-shaped configuration. Openings 334 and 335 may be formed beneath hooks 320 and 321, respectively.

Releasable latch assembly 322 preferably includes latch portion 324, handle 326, longitudinal spring 332, and fastener 330. Releasable latch assembly 322 is selectively movable between a first, catch position 327, as shown, and a second, release position in the direction of arrow 328. Fastener 330 attaches longitudinal spring 332 to front rail interface 308. Preferably, longitudinal spring 332 applies force to latch portion 324, forcing latch portion 324 to extend through opening 334. To move longitudinal spring assembly to release position 328, force may be selectively applied to handle 326 in the direction of arrow 328.

Although the disclosed embodiments have been described in detail, it should be understood that various changes, substitutions and alterations can be made to the embodiments without departing from their spirit and scope.

What is claimed is:

1. A rack system, comprising:
   a rack having a plurality of rails, each rail having a standard interface portion;
   a pair of arm assemblies for supporting a computer system component, each arm assembly comprising:
   an arm having a first end and a second end;
   a first rail interface disposed at the first end of the arm and having at least one hook formed to tool-lessly and releasably secure the first end of the arm to the standard interface portion of a rail;
   the first rail interface further having a selectively releasable securing mechanism operable to releasably interface with the standard interface portion of one of the rails; and
   a second rail interface disposed at the second end of the arm and formed to tool-lessly and releasably secure the second end of the arm to the standard interface portion of a rail.

2. The rack system of claim 1, further comprising the hook extending from the front rail interface having a downward-facing, generally L-shaped configuration.

3. The rack system of claim 1 wherein the securing mechanism further comprises a latch assembly operable to releasably interface with the standard interface portion of the one of the rails.

4. The rack system of claim 3, further comprising:
   the latch assembly selectively movable between a first position and a second position;
   the first position operable to secure the arm assembly to the standard interface portion of the respective rail; and
   the second position operable to allow the arm assembly to be removed from the respective rail.

5. The rack system of claim 3, wherein the latch assembly further comprises a spring activated latch assembly.

6. The rack system of claim 3, wherein the latch assembly further comprises a longitudinal spring activated latch assembly.

7. The rack system of claim 1 wherein the standard interface further comprises an EIA standard RS 310-type interface.

8. The rack system of claim 1, further comprising the first rail interface having an adjustment slot operable to selectively move the arm between a lengthened position and a shortened position with respect to the arm.

9. The rack system of claim 1, further comprising:
   the standard interface portion divided into a plurality of mounting units;
   a first aperture, a second aperture, and a third aperture vertically spaced within each mounting unit; and
   the front rail interface having a first hook and a second hook vertically spaced to align with a first aperture and a third aperture, respectively.

10. The rack system of claim 9, further comprising the mounting units, first aperture, second aperture, and third aperture vertically spaced in accordance with EIA Rack Standard 310.

11. The rack system of claim 1, further comprising a slide assembly coupled to the arm and selectively movable between an extended position and a retracted position.

12. An arm assembly for supporting computer system components in a rack system, comprising:
   an arm having a first end and a second end;
   a first rail interface disposed at the first end of the arm and having at least one hook formed to tool-lessly and releasably secure the first end of the arm to the standard interface portion of a rail;
   the first rail interface further having a selectively releasable securing mechanism operable to releasably interface with the standard interface portion of a first rack rail; and
   a second rail interface disposed at the second end of the arm and formed to tool-lessly and releasably secure the second end of the arm to the standard interface portion of a second rack rail.

13. The arm assembly of claim 12, further comprising the hook extending from the front rail interface having a downward-facing, generally L-shaped configuration.

14. The arm assembly of claim 13, wherein the securing mechanism further comprises a latch assembly.

15. The arm assembly of claim 14, further comprising:
   the latch assembly selectively movable between a catch position and a release position;
   the catch position operable to secure the support assembly to the standard interface portion of the rails; and
   the release position operable to allow the arm assembly to be removed from the rails.

16. The arm assembly of claim 14, wherein the latch assembly further comprises a spring loaded latch assembly.

17. The arm assembly of claim 14, wherein the latch assembly further comprises a longitudinal spring loaded latch assembly.

18. A rail interface assembly for releasably installing a computer component support arm assembly within a rack, comprising:

a pair of rail interfaces, each rail interface having:
at least one hook extending from the rail interface formed to interface with an interface portion of a rack rail;
a securing mechanism operable to releasably interface with the interface portion of the rack rail; and each rail interface operable to releasably attach to respective ends of a computer component support arm.

19. The rail interface assembly of claim 18, further comprising a hook extending from each rail interface having a downward facing, generally L-shaped configuration.

20. The rail interface assembly of claim 18, wherein the securing mechanism further comprises a latch assembly.

21. The rail interface assembly of claim 20, wherein the latch assembly further comprises a spring loaded latch assembly.

22. A method for installing an arm assembly for supporting a computer system component within a rack system comprising:

aligning a first rail interface coupled to a first end of an arm assembly with an interface portion of a first rail of a rack system;

tool-lessly and releasably securing at least one hook protruding from the first rail interface to the interface portion of the first rail;

aligning a second rail interface on a second end of the arm assembly with an interface portion of a second rail of the rack system; and tool-lessly and releasably securing at least one hook protruding from the second rail interface to the interface portion of the second rail.

23. The method of claim 22, wherein tool-lessly and releasably securing the first rail interface comprises:

inserting the at least one hook protruding from the first rail into the interface portions of the first rail; and engaging a selectively releasable latch assembly of the first rail interface with the interface portion of the first rail.

24. The method of claim 22, further comprising:

extending portions of slide assemblies associated with the arm assemblies;

securing a computer component to the extended portions of the slide assemblies; and retracting the slide assemblies to house the component within the rack.

25. The method of claim 23, wherein securing the first arm assembly further comprises:

aligning the at least one hook of the first rail interface of the arm assembly with the interface portion of the first rail such that the latch assembly moves to a release position; and positioning the first arm assembly with respect to the rack rails such that the latch assembly moves to a catch position which releasably secures the arm assembly to the rack rail.

26. The method of claim 22, further comprising:

aligning a first hook with a first aperture within a rack rail mounting unit; and aligning a second hook with a third aperture within a rack rail mounting unit, the first and third aperture separated by at least one second aperture.

27. A method for installing a computer component within a rack system:

tool-lessly and releasably securing an arm assembly to rack rails, the arm assembly having at least one rail interface slidably attached thereto, the rail interface having at least one hook protruding therefrom; and installing a computer component to the arm assembly.

28. The method of claim 27, further comprising releasably securing a pair of arm assemblies to the rack rails, one for each side of the computer component.

29. The method of claim 27, wherein tool-lessly and releasably securing the arm assembly to the rack rails further comprises:

aligning and securing a first rail interface of the arm assembly with a first rack rail; and aligning and securing a second rail interface of the arm assembly with a second rack rail.

30. A method for installing a computer component within a rack system comprising:

tool-lessly and releasably securing a pair of arm assemblies to rack rails, one for each side of a computer component;

releasably securing a latch assembly associated with a first rail interface associated with the arm assembly to the first rack rail; and installing the computer component to the arm assemblies.

31. A method for manufacturing an arm assembly for supporting a computer system component in a rack system, comprising:

forming an arm having a first end and a second end;

coupling a first rail interface having at least one hook portion to the first end of the arm, the first rail interface formed to tool-lessly and releasably secure the first end of the arm to a standard interface portion of a first rail; and coupling a second rail interface having at least one hook portion to the second end of the arm, the second rail interface formed to tool-lessly and releasably secure the second end of the arm to a standard interface portion of a second rail.

32. The method of claims 31, wherein coupling the first rail interface comprises coupling a first rail interface formed to have a selectively releasable securing mechanism operable to releasably interface with the standard interface portion of the first rail.

* * * * *